US012701858B2

(12) United States Patent
Pu et al.

(10) Patent No.: US 12,701,858 B2
(45) Date of Patent: Aug. 4, 2026

(54) DISPLAY PANEL ARRANGED WITH HEAVILY DOPED SEMICONDUCTOR CONNECTION LINE DISPLAY AND METHOD OF PREPARING THE SAME

(71) Applicant: HKC CORPORATION LIMITED, Shenzhen (CN)

(72) Inventors: Yang Pu, Shenzhen (CN); Haoxuan Zheng, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 636 days.

(21) Appl. No.: 18/084,476

(22) Filed: Dec. 19, 2022

(65) Prior Publication Data

US 2024/0074229 A1     Feb. 29, 2024

(30) Foreign Application Priority Data

Aug. 30, 2022     (CN) .......................... 202211058580.0

(51) Int. Cl.
*H10K 50/844*          (2023.01)
*H10K 59/131*          (2023.01)
(Continued)

(52) U.S. Cl.
CPC ......... *H10K 50/8445* (2023.02); *H10K 71/00* (2023.02); *H10K 59/1201* (2023.02); *H10K 59/131* (2023.02); *H10K 59/179* (2023.02)

(58) Field of Classification Search
CPC ............... H10K 50/8445; H10K 71/00; H10K 59/1201; H10K 59/131; H10K 59/179; G09F 9/335
See application file for complete search history.

(56) References Cited

U.S. PATENT DOCUMENTS

| | | | |
|---|---|---|---|
| 2005/0248270 A1 | 11/2005 | Ghosh et al. | |
| 2012/0228624 A1* | 9/2012 | Sakai | G02F 1/13458 |
| | | | 257/E33.064 |

(Continued)

FOREIGN PATENT DOCUMENTS

| | | |
|---|---|---|
| CN | 104393023 A | 3/2015 |
| CN | 106653796 A | 5/2017 |

(Continued)

OTHER PUBLICATIONS

Chinese First Office Action, Chinese Application No. 202211058580.0, mailed Jul. 20, 2023. (15 pages).

*Primary Examiner* — Jacob Y Choi
*Assistant Examiner* — Grace Cha

(57) ABSTRACT

A display device includes a substrate, a display unit, a binding unit, and an encapsulation layer. The substrate includes an effective display region and a non-display region adjacent to the effective display region, and includes a silicon-containing compound material. The display unit is arranged in the effective display region. The binding unit is arranged in the non-display region and includes a binding portion and signal connection lines. Two ends of the signal connection line are connected to the display unit and the binding portion, respectively. The encapsulation layer wraps the display unit and a part of the signal connection lines The encapsulation layer covers a portion of each of the plurality of signal connection lines, at least a portion of each of the plurality of signal connection lines disposed inside a region covered by the encapsulation layer is configured as a heavily doped semiconductor connection line.

12 Claims, 5 Drawing Sheets

(51) Int. Cl.
    *H10K 71/00*       (2023.01)
    *H10K 59/12*       (2023.01)
    *H10K 59/179*     (2023.01)

(56)           References Cited

U.S. PATENT DOCUMENTS

| | | | | |
|---|---|---|---|---|
| 2017/0025444 A1* | 1/2017 | Hirakata | ................ | H10K 59/40 |
| 2018/0308903 A1* | 10/2018 | Jeong | .................... | G06F 3/0418 |
| 2020/0388665 A1* | 12/2020 | Jung | ................... | H10K 59/131 |

FOREIGN PATENT DOCUMENTS

| | | | |
|---|---|---|---|
| CN | 107221535 A | 9/2017 |
| CN | 112670317 A | 4/2021 |
| CN | 113410274 A | 9/2021 |
| JP | 2001230253 A | 8/2001 |
| JP | 2009020129 A | 1/2009 |

* cited by examiner

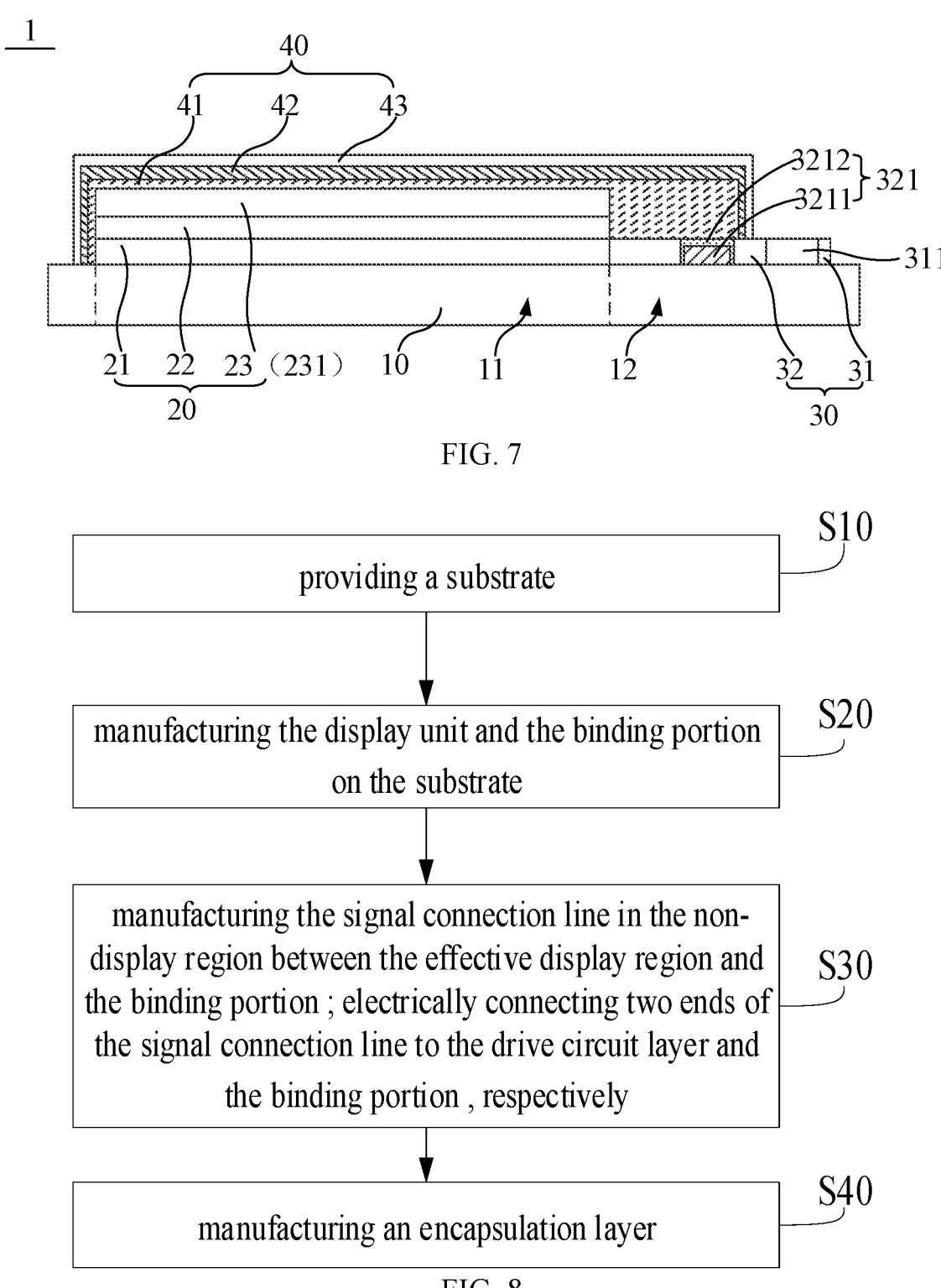

FIG. 7

| S10 |
| --- |
| providing a substrate |

| S20 |
| --- |
| manufacturing the display unit and the binding portion on the substrate |

| S30 |
| --- |
| manufacturing the signal connection line in the non-display region between the effective display region and the binding portion ; electrically connecting two ends of the signal connection line to the drive circuit layer and the binding portion , respectively |

| S40 |
| --- |
| manufacturing an encapsulation layer |

DISPLAY PANEL ARRANGED WITH HEAVILY DOPED SEMICONDUCTOR CONNECTION LINE DISPLAY AND METHOD OF PREPARING THE SAME

CROSS REFERENCE TO RELATED APPLICATIONS

The present application claims the priority of the Chinese patent application No. 202211058580.0, filed on Aug. 30, 2022, and the contents of which are incorporated herein by their entireties.

TECHNICAL FIELD

The present disclosure relates to the field of displaying, and in particular to a display device, a display panel, and a method of preparing the display panel.

BACKGROUND

As the optoelectronic displaying technology and the semiconductor manufacturing technology develop, the technology of display panels configured with thin film transistors (TFTs) has become mature. Especially, the organic light-emitting diode display having the TFT (TFT-OLED) has obvious advantages about a thickness, colour saturation, contrast ratio, flexible display and other aspects. Development of the OLED display has a broad prospect.

Currently, since organic light-emitting materials used for the OLED are highly sensitive to water steam and oxygen, the materials may be easily deteriorate and fail when being encountered with water and oxygen, resulting in abnormal displaying. Therefore, the OLED needs to be encapsulated and protected to prevent the water and the oxygen from entering the panel. Usually, an encapsulation structure may include a silicon oxynitride layer, an organic layer and a silicon nitride layer to effectively protect the OLED. Further, an encapsulation layer may cover the entire OLED display panel, to block external water and oxygen.

However, since a binding portion of a binding unit needs to be bound to and connected to a driver IC, the binding portion cannot be covered by the encapsulation layer. The encapsulation layer may cover a signal connection line that connects the binding portion to a display region. Therefore, a lowermost layer of the encapsulation layer is poorly sealed to the signal connection line, enabling the water and the oxygen to easily enter the display region from the binding portion, moving along the signal connection line, causing failure of the OLED, and the display panel may have a poor displaying effect.

SUMMARY OF THE DISCLOSURE

The present disclosure provides a display device, a display panel, and a method of preparing the display panel, and aims to solve the technical problem of the failure of the OLED, which is caused by the water and the oxygen entering the display region from the binding portion due to the lowermost layer of the encapsulation layer being poorly sealed to the signal connection line.

According to a first aspect of the present disclosure, a display panel is provided and includes:

a substrate, comprising an effective display region and a non-display region adjacent to the effective display region, wherein the substrate comprises a silicon-containing compound material;

a display unit, configured to display an image and arranged in the effective display region, which is located on a side of the substrate;

a binding unit, arranged in the non-display region, which is located on a side of the substrate, and comprising a binding portion and a plurality of signal connection lines, wherein two ends of each of the plurality of signal connection lines are connected to the display unit and the binding portion, respectively;

an encapsulation layer, wrapping the display unit and a part of the plurality of signal connection lines, and configured to encapsulate the display unit and the plurality of signal connection lines, wherein the encapsulation layer comprises a first encapsulation layer, a second encapsulation layer and a third encapsulation layer, which are laminated successively in a direction away from the substrate; the first encapsulation layer and the third encapsulation layer comprise the silicone-containing compound material, and the second encapsulation layer comprises an organic material;

wherein the encapsulation layer covers a portion of each of the plurality of signal connection lines, at least a portion of each of the plurality of signal connection lines disposed inside a region covered by the encapsulation layer is configured as a heavily doped semiconductor connection line, and the first encapsulation layer wraps around the heavily doped semiconductor connection line.

According to a second aspect of the present disclosure, a method of preparing a display panel is provided and includes:

providing a substrate, wherein the substrate comprises an effective display region and a non-display region adjacent to the effective display region, and the substrate comprises a silicon-containing compound material;

arranging a display unit and a binding portion on the substrate, wherein the display unit is formed in the effective display region on a side of the substrate, and the binding portion is formed in the non-display region on a side of the display unit;

arranging a plurality of signal connection lines in the non-display region between the effective display region and the binding portion, and electrically connecting two ends of each of the plurality of signal connection lines to a drive circuit layer and the binding portion, respectively, wherein at least a part of each of the plurality of signal connection lines is configured as a heavily doped semiconductor connection line; and arranging an encapsulation layer; successively arranging a first encapsulation layer, a second encapsulation layer, a third encapsulation layer, which are laminated, in a direction away from the substrate.

The first encapsulation layer and the third encapsulation layer comprise a silicon-containing compound material, and the second encapsulation layer comprises an organic material; the first encapsulation layer is arranged to wrap around the display unit and a portion of each of the plurality of signal connection lines; at least a portion of each of the plurality of signal connection lines disposed inside a region covered by the encapsulation layer is configured as the heavily doped semiconductor connection line, and the first encapsulation layer wraps around the heavily doped semiconductor connection line.

According to a third aspect, a display device is provided and includes:

a display panel, configured to display images and is the display panel according to the above aspect or the display panel prepared by performing the method of preparing the display panel according to the above aspect; and a control board, bound to the binding portion and configured to control, through the binding portion, the display panel to display images.

BRIEF DESCRIPTION OF THE DRAWINGS

In order to illustrate more clearly the technical solutions of the embodiments or the related art of the present disclosure, the drawings required for describing the embodiments or the related art will be briefly described in the following. Apparently, the drawings in the following description show only some of the embodiments of the present disclosure, and other drawings may be obtained by any ordinary skilled person in the art based on these drawings without any creative work.

FIG. 7 is a structural schematic view of a top view of a display panel according to a fourth embodiment of the present disclosure.

FIG. 8 is a flow chart of a method of preparing a display panel according to an embodiment of the present disclosure.

REFERENCE NUMERALS

Figure 1:
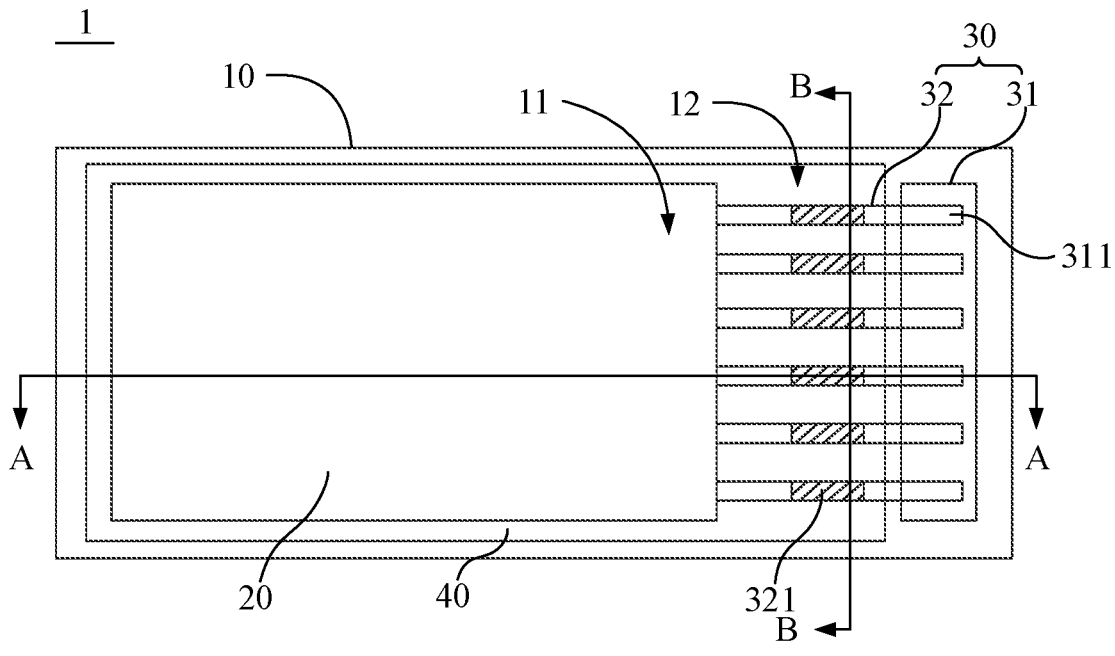
FIG. 1 is a structural schematic view of a top view of a display panel according to an embodiment of the present disclosure.

1—display panel; 10—substrate; 11—effective display region; 12—non—display region; 20—display unit; 21—drive circuit layer; 22—planarized layer; 23—organic light emitting unit; 231—organic light emitting layer; 30—binding unit; 31—binding portion; 311—binding terminal; 32—signal connection line; 321—heavily doped semiconductor connection line; 3211—heavily doped semiconductor layer; 3212—inorganic oxide layer; 322—metal connecting line; 323—first metal line; 324—second metal line; 40—encapsulation layer; 41—first encapsulation layer; 42—second encapsulation layer; 43—third encapsulation layer; 100—display device; 2—control board.

DETAILED DESCRIPTION

Technical solutions in the embodiments of the present disclosure will be clearly and completely described below by referring to the accompanying drawings in the embodiments of the present disclosure. Apparently, the embodi-ments show only a part of but not all of the embodiments of the present disclosure. Based on the embodiments in the present disclosure, all other embodiments obtained by any ordinary skilled person in the art, without creative work, shall fall within the scope of the present disclosure.

Terms "first", "second" and "third" in the embodiments of the present disclosure are used for descriptive purposes only and shall not be understood as indicating or implying relative importance or implicitly specifying the number of indicated technical features. Therefore, a feature defined by the "first", "second" and "third" may explicitly or implicitly include at least one such feature. In the description of the present disclosure, "plurality" means at least two, such as two, three, and so on, unless otherwise expressly and specifically limited. Terms "includes", "has", and any variation thereof, are intended to cover non-exclusive inclusion. For example, a process, a method, a system, a product or an apparatus including a series of operations or units is not limited to the listed operations or units, but may further includes operations or units that are not listed, or includes other operations or units that are inherently included in the process, the method, the product or the apparatus.

References herein to "embodiments" mean that particular features, structures or characteristics described in an embodiment may be included in at least one embodiment of the present disclosure. The presence of the term in various sections in the specification does not necessarily mean a same embodiment, nor a separate or an alternative embodiment that is mutually exclusive with other embodiments. It is understood, both explicitly and implicitly, by any ordinary skilled person in the art that the embodiments described herein may be combined with other embodiments.

The present disclosure will be described in detail by referring to the drawings and the embodiments in the following.

Figure 2:
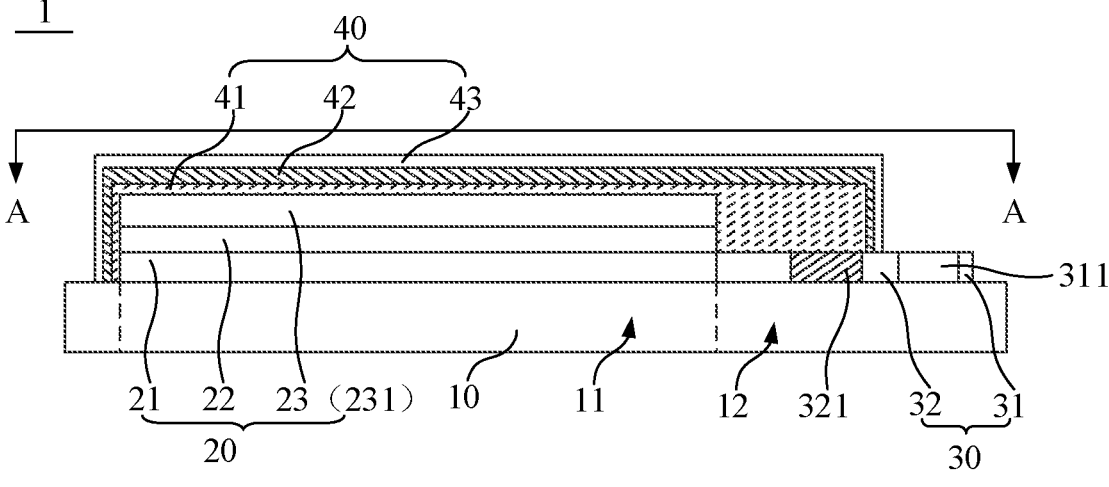
FIG. 2 is a structural schematic view of a cross section of the display panel shown in FIG. 1, taken along a line A-A.
Figure 3:
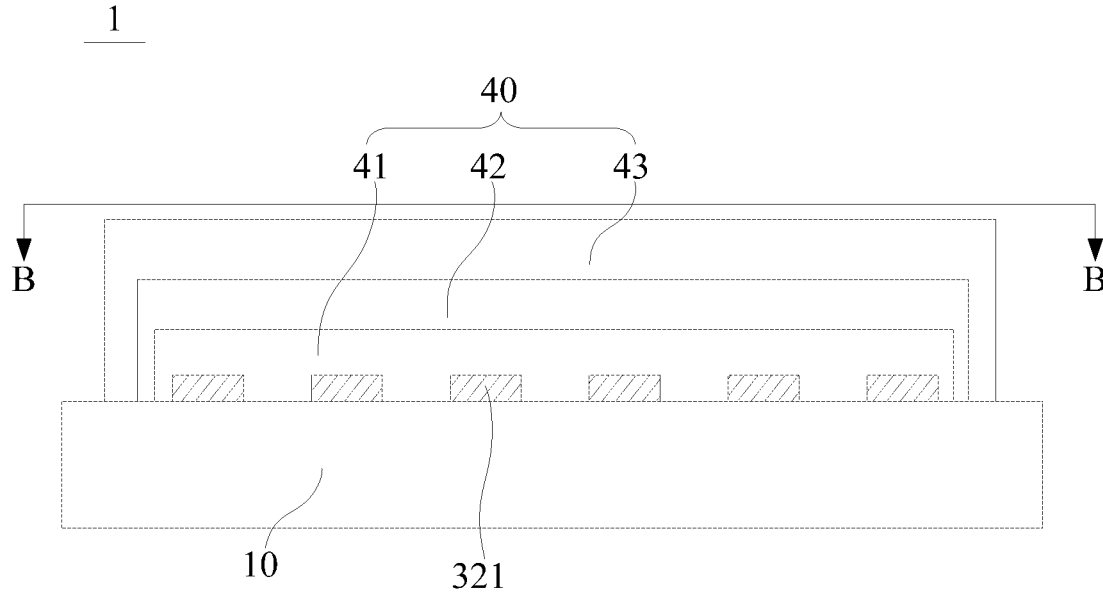
FIG. 3 is a structural schematic view of a cross section of the display panel shown in FIG. 1, taken along a line B-B.

As shown in FIG. 1 to FIG. 3, FIG. 1 is a structural schematic view of a top view of a display panel according to an embodiment of the present disclosure, FIG. 2 is a structural schematic view of a cross section of the display panel shown in FIG. 1, taken along a line A-A, and FIG. 3 is a structural schematic view of a cross section of the display panel shown in FIG. 1, taken along a line B-B.

The present embodiment provides a display panel 1. The display panel 1 includes a substrate 10, a display unit 20, a binding unit 30, and an encapsulation layer 40. The display unit 20, the binding unit 30, and the encapsulation layer 40 are arranged on the substrate 10. The substrate 10 includes an effective display region 11 and a non-display region 12 adjacent to the effective display region 11. The effective display region 11 is configured to arrange the display unit 20 to display an image. Typically, a shape of the effective display region 11 matches a shape of the display unit 20. The non-display region 12 is disposed around the effective display region 11 and is adjacent to the effective display region 11. The non-display region 12 is configured to arrange the binding unit 30 and other non-display components, such as a wiring unit, a drive unit, and so on. In detail, the substrate 10 includes a compound material containing silicon. For example, the substrate 10 may be a silicon-containing glass substrate 10 or a quartz substrate 10, and so on. The substrate may be configured to support and protect the display unit 20 and the binding unit 30, which are arranged on the substrate 10.

As shown in FIG. 2, the display unit 20 is arranged on a side of the substrate 10, disposed in the effective display region 11 of the substrate 10, and is configured to display an image. The display unit 20 may include a drive circuit layer 21, a planarized layer 22 and an organic light emitting unit 23, which are laminated successively along a direction away from the substrate 10. The drive circuit layer 21 is arranged on a side of the substrate 10, and the planarized layer 22 is arranged on a side of the drive circuit layer 21 away from the substrate 10. The planarized layer 22 may be configured to planarize the ground potential of the side of the drive circuit layer 21 away from the substrate 10. Further, the planarized layer 22 may serve as an insulation layer to insulate the drive circuit layer 21 from other adjacent metal layers to prevent short circuits. The organic light emitting unit 23 is arranged on a side of the planarized layer 22 away from the substrate 10 and is electrically connected to the drive circuit layer 21 to receive a drive signal sent from the drive circuit layer 21 to emit light to display the image. In detail, the organic light emitting unit 23 may include an organic light emitting layer 231, a first electrode and a second electrode. The first electrode may be an anode, and the second electrode may be a cathode. The first electrode and the second electrode may be electrically connected to the drive circuit layer 21 to enable the drive circuit layer 21 to drive the organic light emitting layer 231 to emit light to display the image. The organic light emitting layer 231 may specifically include an OLED material.

The binding unit 30 and the display unit 20 are arranged on a same side of the substrate 10, and the binding unit 30 is disposed in the non-display region 12. In detail, the binding unit 30 includes a binding portion 31 and a plurality of signal connection lines 32. The binding portion 31 is arranged in the non-display region 12, which locates on a side of the effective display region 11. The signal connection lines 32 are disposed between the display unit 20 and the binding portion 31. Two ends of each of the plurality of connection signal lines are connected to the display unit 20 and the binding portion 31. The binding portion 31 includes a plurality of binding terminals 311. The plurality of binding terminals 311 and the plurality of signal connection lines 32 are in one-to-one correspondence, and each of the plurality of binding terminals 311 is connected to one of the plurality of signal connection lines 32. The plurality of binding terminals 311 may be formed by extending ends of the plurality of signal connection lines 32 near the binding portion 31 towards the binding portion 31, and are configured to bind a drive IC, such that the drive IC transmits relevant drive signals through the signal connection lines 32 to control the display panel 1 to display the image.

In detail, the encapsulation layer 40 is arranged on a side of the display unit 20 away from the substrate 10 and on sides of the plurality of signal connection lines 32 away from the substrate 10, and wraps around the display unit 20 and a part of each of the plurality of signal connection lines 32. The encapsulation layer 40 is configured to encapsulate the display unit 20 and the plurality of signal connection lines 32, such that the display unit 20 is received inside a space defined by the encapsulation layer 40 and the substrate 10. The external water and the external oxygen may be blocked. The external water and the external oxygen may be prevented from entering the display unit 20, and from contacting the organic light emitting unit 23 in the display unit 20 to cause the organic light emitting unit 23 to be deteriorated and failed, such that abnormal displaying of the display panel 1 may be avoided. Further, in the non-display region 12, where the signal connection lines 32 are arranged, the encapsulation layer 40 wraps around a part of each of the plurality of signal connection lines 32. In detail, the encapsulation layer 40 extends from the effective display region 11 to the non-display region 12 and wraps around a part of the non-display region 12. In this way, encapsulation effectiveness of the encapsulation layer 40 may be improved, the external water and the external oxygen may be prevented from entering the effective display region 11 from a side of the effective display region 11, and the external water and the external oxygen may be prevented from contacting the organic light emitting layer 231 of the organic light emitting unit 23, and the organic light emitting layer 231 may be prevented from being deteriorated and being failed.

It shall be understood that, in order to prevented deterioration of the encapsulation layer 40 caused by heating and light irradiation, which may lead to failure of the encapsulation, the encapsulation layer 40 includes a first encapsulation layer 41, a second encapsulation layer 42 and a third encapsulation layer 43, which are arranged successively in a direction of the substrate 10. The first encapsulation layer 41 and the third encapsulation layer 43 include the silicone-containing compound material. The second encapsulation layer 42 includes the organic material. It shall be understood that the encapsulation layer 40 is a sandwich structure having the "inorganic layer organic layer inorganic layer". In this way, the organic layer, which is susceptible to heating and light irradiation, is disposed between the two inorganic layers, the service life of the encapsulation layer 40 may be increased, and the encapsulation effectiveness of the encapsulation layer 40 may be improved. To ensure conductive effectiveness, the signal connection lines 32 are usually made of metal. However, the applicant found that, even if the encapsulation layer 40 is arranged in the above-mentioned manner, the external water and the external oxygen may still enter the effective display region 11, contacting the organic light emitting layer 231 in the organic light emitting unit 23, and the organic light emitting layer 231 may be deteriorated and failed, such that the display panel 1 may display images abnormally. After extensive research, the applicant found that, matching between lattice of the inorganic material of the first encapsulation layer 41 of the encapsulation layer 40 closest to the signal connection lines 32 and lattice of the metal of the signal connection lines 32 may be poor, such that encapsulation effectiveness of the contact surface between the first encapsulation layer 41 and the signal connection lines 32 may be poor. The external water and the external oxygen may enter effective display region 11 from the binding portion 31 along the signal connection lines 32, such that the organic light emitting layer 231 of the organic light emitting unit 23 may be failed, causing the display panel 1 to display images abnormally.

In the present embodiment, in order to solve the above technical problem, at least a part of each of the plurality of signal connection lines 32 disposed inside the encapsulation region of the encapsulation layer 40 is configured as a heavily doped semiconductor connection line 321 (serving as a segment of one entire signal connection line), such that the first encapsulation layer 41 wraps around the heavily doped semiconductor connection line 321. It shall be understood that each of the plurality of signal connection lines 32, disposed inside the encapsulation region of the encapsulation layer 40, has at least a part served as the heavily doped semiconductor connection line 321. The material of the heavily doped semiconductor connection line 321 includes an inorganic semiconductor material, such as heavily doped silicon, heavily doped germanium, a metal oxide semiconductor material, indium tin oxide (ITO), indium zinc oxide (IZO), and so on. In this way, lattice of the inorganic semiconductor material of the heavily doped semiconductor connection line 321 is highly matched with lattice of the silicon-containing compound of the first encapsulation layer 41. That is, the heavily doped semiconductor connection line 321 may be bonding to the first encapsulation layer 4 more tightly, and the sealing effectiveness of the contact surface between the first encapsulation layer 41 and the signal connection lines 32 may be improved. Therefore, the external water and the external oxygen may be prevented from entering the effective display region 11 from the binding portion 31 along the signal connection lines 32, the organic light emitting layer 231 of the organic light emitting unit 23 may be prevented from being failed, and the display panel 1 may not display images abnormally.

Further, the material of the heavily doped semiconductor connection line 321 includes a heavily doped semiconductor material, and a doping concentration is greater than a predefined threshold, ensuring the heavily doped semiconductor connection line 321 to be conductive effectively. In the present embodiment, the doping concentration of the heavily doped semiconductor material of the heavily doped semiconductor connection line 321 is greater than or equal to $10^{19}$ cm$^{-3}$ to improve the conductivity of the heavily doped semiconductor, ensuring the conductivity effectiveness of the heavily doped semiconductor connection line 321. In detail, the heavily doped semiconductor material may include an N-type heavily doped semiconductor material or a P-type heavily doped semiconductor material, such as an N-type heavily doped silicon material, a P-type heavily doped silicon material, or other semiconductor materials.

As shown in FIG. 3, further, in the encapsulation region of the encapsulation layer 40, lattice of the inorganic semiconductor material of the heavily doped semiconductor connection line 321 of each signal connection line 32 is also highly matched to lattice of the silicon-containing compound of the substrate 10. That is, the heavily doped semiconductor connection line 321 may be bonding to the substrate 10 more tightly, improving the sealing effectiveness of the contact surface between the substrate 10 and the signal connection line 32. That is, along a circumferential direction of the heavily doped semiconductor connection line 321, the heavily doped semiconductor connecting line 321 is more tightly bonded to the first encapsulation layer 41 and the substrate 10. In this way, the external water and the external oxygen may be effectively prevented from entering the effective display region 11 from the heavily doped semiconductor connecting line 321. The external water and the external oxygen may be effectively prevented from entering the effective display region 11 from the binding portion 31 along the signal connection line 32, the organic light emitting layer 231 of the organic light emitting unit 23 may be prevented from being failed, such that the display panel 1 may not display images abnormally.

Figure 4:
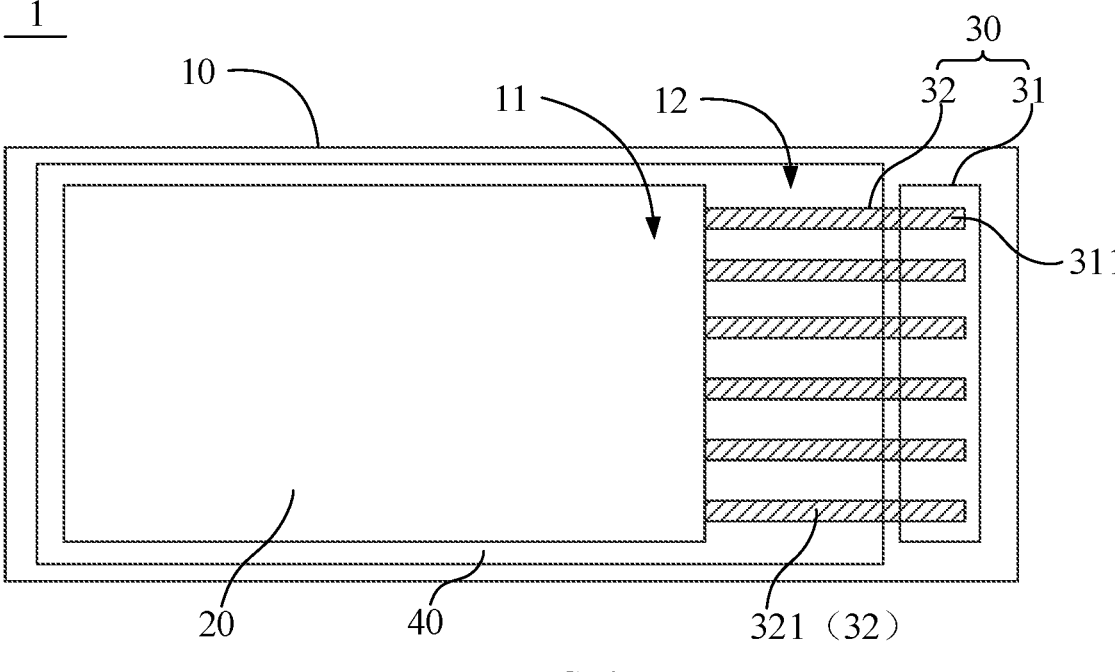
FIG. 4 is a structural schematic view of a top view of a display panel according to a first embodiment of the present disclosure.

As shown in FIG. 4, FIG. 4 is a structural schematic view of a top view of a display panel according to a first embodiment of the present disclosure. In the present embodiment, at least a portion of the plurality of signal connection lines 32 is entirely configured as the aforementioned heavily doped semiconductor connection lines 321. The first encapsulation layer 41 wraps around the heavily doped semiconductor connection line 321, and an end of the heavily doped semiconductor connection line 321 near the binding portion 31 is exposed to connect to the binding portion 31 to form a binding terminal 311. That is, at least one signal connection line of the plurality of signal connection lines 32 is entirely configured as the heavily doped semiconductor connection line 321. It shall be understood that, for the plurality of signal connection lines 32, some connection lines of the plurality of signal connection lines are entirely configured as heavily doped semiconductor connection lines 321; and a portion of the remaining signal connection lines 32 disposed inside the encapsulated region of the encapsulation layer 40 is configured as the heavily doped semiconductor connection line 321, and the remaining portion of the remaining signal connection lines 32 are made of metal. For example, the plurality of signal connection lines 32 may be grouped into a first set of signal connection lines and a second set of signal connection lines. Each connection line of the first set of signal connection lines may be entirely configured as the heavily doped semiconductor connection line 321. For the second set of signal connection lines, each connection line has a portion disposed inside the encapsulated region of the encapsulation layer 40, and the portion is configured as the heavily doped semiconductor connection line 321; and the remaining portion of each connection line of the second set of signal connection lines is made of metal. Alternatively, each of the plurality of signal connection lines 32 may be entirely configured as the heavily doped semiconductor connection line 321. In this way, the signal connection lines 32 may be configured more flexibly, and may be configured based on actual needs. For example, a short signal connection line 32 may be entirely configured as the heavily doped semiconductor connection line 321. For a long signal connection line 32, a portion disposed inside the encapsulation region may be configured as the heavily doped semiconductor connection line 321, and the remaining portion may be configured as a connection line made of metal. By configuring the signal connection line 32 in this manner, the sealing effectiveness that the encapsulation layer encapsulates the signal connection lines 32 may be ensured, and the conductivity effectiveness of the signal connection lines 32 may be ensured. Moreover, when the signal connection line 32 is entirely configured as the heavily doped semiconductor connection line 321, an effective encapsulation length that the encapsulation layer 40 encapsulates the signal connection lines 32 may be extended, and the signal connection lines 32 may be connected to the encapsulation layer 40 more tightly.

Figure 5:
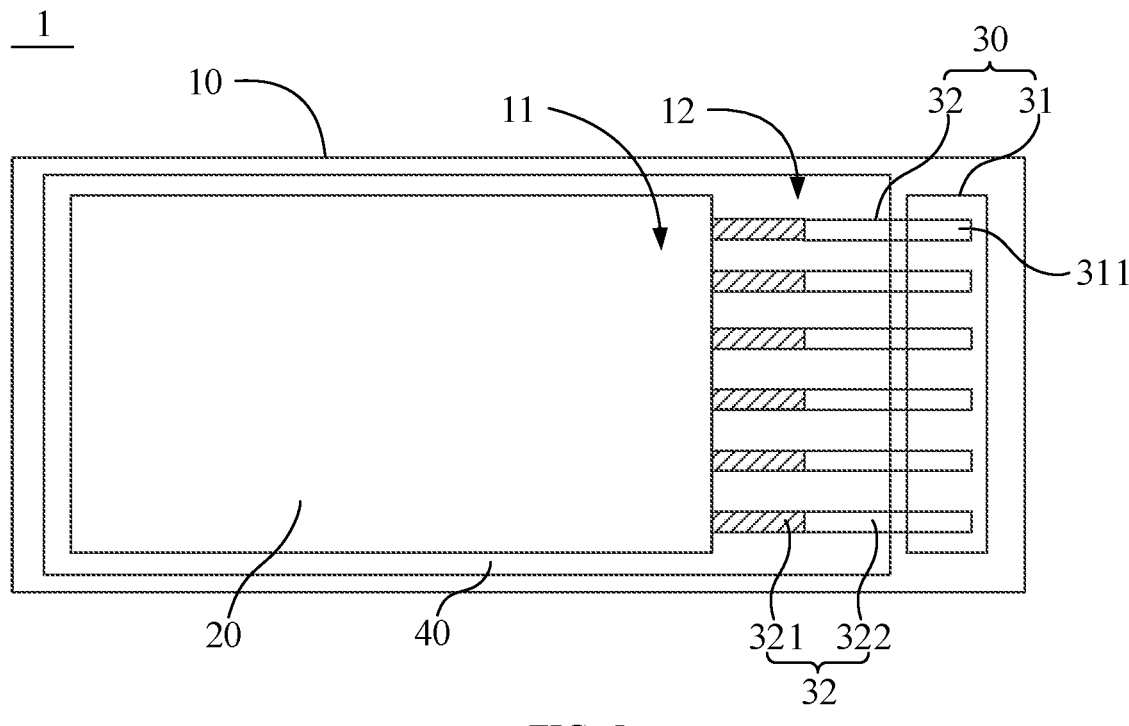
FIG. 5 is a structural schematic view of a top view of a display panel according to a second embodiment of the present disclosure.

As shown in FIG. 5, FIG. 5 is a structural schematic view of a top view of a display panel according to a second embodiment of the present disclosure. In the present embodiment, at least a portion of the plurality of signal connection lines 32 include a metal connection line 322 and a heavily doped semiconductor connection line 321 connected to the metal connection line 322. A length of the metal connection line 322 is greater than a length of the heavily doped semiconductor connection line 321. That is, at least one signal connection line of the plurality of signal connection lines 32 includes the metal connection line 322 and the heavily doped semiconductor connection line 321 connected to the metal connection line 322. The metal connection line 322 may be arranged at an end of the heavily doped semiconductor connection line 321 near the binding portion 31. That is, the metal connection line 322 is a portion of the signal connection line 32 near the binding portion 31, and the heavily doped semiconductor connection line 321 is a portion of the signal connection line 32 near the effective display region 11. In this way, the end of the metal connection line 322 near the binding portion 31 extends to the binding portion 31 and serves as the binding terminal 311 of the binding portion 31, configured to bind the drive IC, such that an effective electrical connection with the drive IC may be ensured. Alternatively, the metal connecting line 322 is disposed at the end of the heavily doped semiconductor connecting line 321 near the effective display region 11. That is, the part of the signal connection line 32 near the effective display region 11 is the metal connection line 322, and the part of the signal connection line 32 near the binding portion 31 is the heavily doped semiconductor connection line 321. In this way, the part of the signal connection line 32 near the binding portion 31 may bond more tightly with the encapsulation layer 40. The water and the oxygen may be immediately blocked from entering along the signal connection line 32 when the water and the oxygen is approaching the signal connection line 32 at the end of the binding portion 31, such that the encapsulation effectiveness of the encapsulation layer 40 may be improved. To be noted that, when the portion of the signal connection line 32 near the binding portion 31 is the heavily doped semiconductor connection line 321, the end of the heavily doped semiconductor connection line 321 near the binding portion 31 extends to the binding portion 31 and serves as the binding terminal 311, and that is, the binding terminal 311 is made of the heavily doped semiconductor material. Since the binding terminal 311 needs to be exposed for binding the drive IC, a surface of the binding terminal 311 may be highly susceptible to be oxidized, forming an oxide film layer. In this way, when the drive IC is bound to the binding portion 31, the oxide film layer on the surface of the binding terminal 311 needs to be removed first to ensure the drive IC to be conductive effectively with the binding terminal 311. The oxide film layer may be removed by dry etching and so on.

Further, in the present embodiment, the length of the metal connection line 322 is greater than the length of the heavily doped semiconductor connection line 321, such that a load of the heavily doped semiconductor connection line 321 may be reduced, and conductive-wire performance of the signal connection line 32 may be improved, preventing the IR drop and power consumption of the display panel 1 from being increased.

Figure 6:
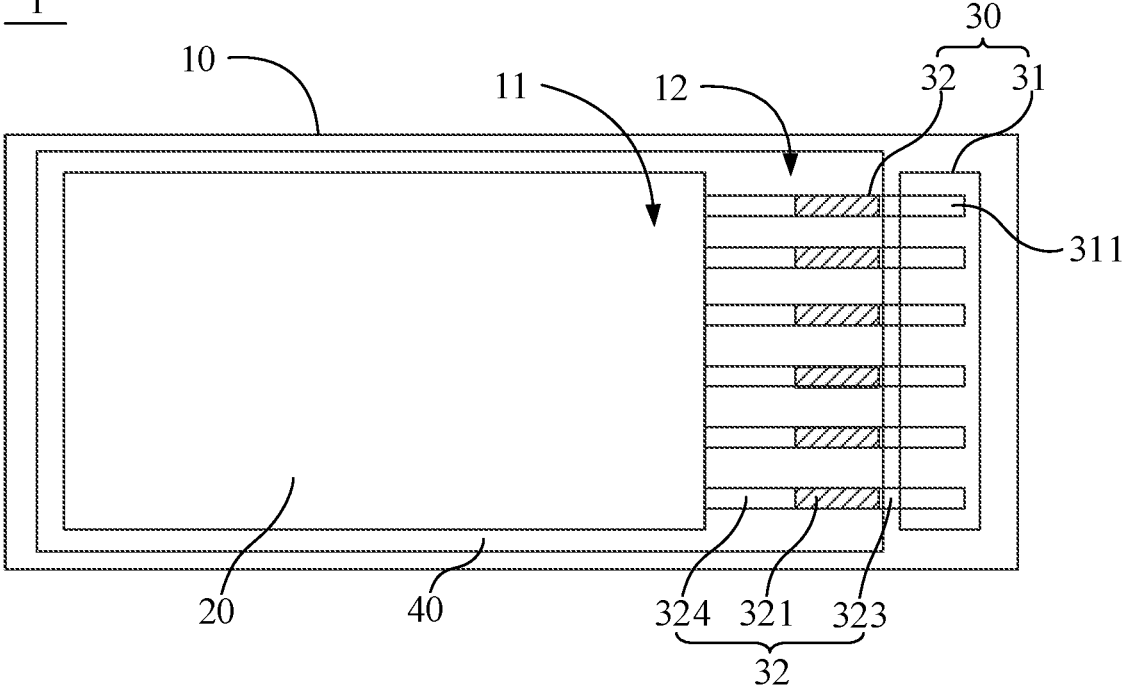
FIG. 6 is a structural schematic view of a top view of a display panel according to a third embodiment of the present disclosure.

As shown in FIG. 6, FIG. 6 is a structural schematic view of a top view of a display panel according to a third embodiment of the present disclosure. In the present embodiment, at least a part of each of the plurality of signal connection lines 32 includes a first metal line 323, a heavily doped semiconductor connection line 321 and a second metal line 324, which are connected in sequence. The first metal line 323 is connected to the binding portion 31, and the second metal line 324 is connected to the display unit 20, such that one signal connection line 32 is formed, and a sum of the length of the first metal line 323 and the length of the second metal line 324 is greater than the length of the heavily doped semiconductor connection line 321. That is, at least one signal connection line of the plurality of signal connection lines 32 includes the first metal line 323, the heavily doped semiconductor connection line 321 and the second metal line 324, which are connected with each other in sequence. The first metal line 323, the heavily doped semiconductor connection line 321 and the second metal line 324 are arranged in sequence and are connected from end-to-end so as to form one signal connection line 32. A middle part of the signal connection line 32 is the heavily doped semiconductor connection line 321, and two end portions of the signal connection line 32 are the first metal line 323 and the second metal line 324, respectively. The first metal line 323 is connected to the binding portion 31, and the first metal line 323 extends to an end of the binding portion 31 to serve as the connection terminal. In the present embodiment, the middle part of the signal connection line 32 is configured as the heavily doped semiconductor connec- tion line 321 and bonds more tightly with the encapsulation layer 40, the water and the oxygen are blocked effectively, the external water and the external oxygen cannot enter the effective display region 11 along the signal connection line 32, such that the encapsulation effectiveness of the encap- sulation layer 40 may be improved.

Further, in the present embodiment, the sum of the length of the first metal line 323 and the length of the second metal line 324 is greater than the length of the heavily doped semiconductor connection line 321, such that the load of the heavily doped semiconductor connection line 321 may be reduced, and the conductive-wire performance of the signal connection line 32 may be improved, preventing the IR drop and power consumption of the display panel 1 from being increased.

As shown in FIG. 7, FIG. 7 is a structural schematic view of a top view of a display panel according to a fourth embodiment of the present disclosure. In the present embodiment, the heavily doped semiconductor link 321 includes a heavily doped semiconductor layer 3211 and an inorganic oxide layer 3212. Inorganic oxide of the inorganic oxide layer 3212 corresponds to the semiconductor of the heavily doped semiconductor connection line 321. The inorganic oxide layer 3212 wraps around a surface of the heavily doped semiconductor layer 3211 and is wrapped by the first encapsulation layer 41. Since the heavily doped semiconductor material of the heavily doped semiconductor connection line 321 is highly susceptible to be oxidized when contacting the air, an inorganic oxide layer 3212 is formed on a surface of the heavily doped semiconductor layer 3211, such that the inorganic oxide of the inorganic oxide layer 3212 and the semiconductor material of the heavily doped semiconductor layer 3211 are formed. For example, the heavily doped semiconductor layer 3211 includes heavily doped silicon. A surface of the heavily doped silicon layer is oxidized to form a silicon nitride layer. That is, the silicon oxynitride of the formed inorganic oxide layer 3212 corresponds to the heavily doped silicon of the heavily doped semiconductor layer 3211, such that lattice of the inorganic oxide of the inorganic oxide layer 3212 matches better with lattice of the heavily doped silicon of the heavily doped semiconductor layer 3211, the inorganic oxide layer 3212 is tightly bonded to the heavily doped semiconductor layer 3211, and the water and the oxygen cannot pass between the inorganic oxide layer 3212 and the heavily doped semiconductor. Further, the inorganic oxide layer 3212 is encapsulated by the first encapsulation layer 41. Since the lattice of inorganic oxide better matches to the lattice of the material containing silicon compounds, the inorganic oxide layer 3212 may be bonding more tightly with the first encapsulation layer 41. The water and the oxygen cannot pass between the inorganic oxide layer 3212 and the first encapsulation layer 41, further improving the encapsulation effectiveness between the encapsulation layer 40 and the signal connection lines 32.

It shall be understood that, in other embodiments, the plurality of signal connection lines 32 may be a combination of various types of signal connection lines 32 as described in the above embodiments. That is, some connection lines of the plurality of signal connection lines 32 are entirely configured as signal connection lines doped with the semi- conductor; and another some connection lines of the plural- ity of signal connection lines 32 include the metal connec- tion lines 322 and heavily doped semiconductor connection lines 321 connected to the metal connection lines 322; and still another some connection lines of the plurality of signal connection lines 32 include the first metal lines 323, the heavily doped semiconductor connection lines 321 and the second metal lines 324, which are connected in sequence. In this way, the signal connection lines 32 may be configured flexibly and may be configured based on actual needs. While meeting other requirements, the encapsulation effectiveness of between the encapsulation layer 40 and the signal connection lines 32 may be improved, the water and the oxygen may be prevented from entering, between the encapsulation layer 40 and the signal connection lines 32, entering the effective display region 11 along the signal connection lines 32, the organic light emitting layer 231 of the organic light emitting unit 23 may be prevented from being failed, and the display panel 1 may not display images abnormally. For example, according to characteristics of a region where the signal connection lines 32 are disposed and the a total length of the signal connection lines 32, the length of the heavily doped semiconductor connection line of each signal connection line 32 and the doping concentration may be regulated, such that loads of the plurality of signal connection lines 32 may be balanced, improving a displaying quality. Further, each signal connection line 32 may be effectively encapsulated by the encapsulation layer 40.

In the above embodiments, when the end of the signal connection line 32 near the binding portion 31 is the metal line, the encapsulation layer 40 needs to completely wrap the heavily doped semiconductor connection line 321 to protect the heavily doped semiconductor connection line 321. In this way, when the connection line is in a more severe environment in a subsequent process, a strength of the heavily doped semiconductor connection line 321 may not be less than a strength of the metal line, and the heavily doped semiconductor connection line 321 may not be cracked, preventing the display panel 1 from displaying images abnormally.

As shown in FIG. 8, FIG. 8 is a flow chart of a method of preparing a display panel according to an embodiment of the present disclosure. In the present embodiment, a method of preparing the display panel 1 is provided and includes following operations.

In an operation S10, providing a substrate 10. The substrate 10 includes the effective display region 11 and the non-display region 12 adjacent to the effective display region 11. The substrate 10 includes a silicon-containing compound material.

In an operation S20, arranging the display unit 20 and the binding portion 31 on the substrate 10. The display unit 20 is formed in the effective display region 11 on a side of the substrate 10, and the binding portion 31 is formed in the non-display region 12 on a side of the display unit 20.

In an operation S30, arranging the signal connection line 32 in the non-display region 12 between the effective display region 11 and the binding portion 31; electrically connecting two ends of the signal connection line 32 to the drive circuit layer 21 and the binding portion 31, respectively. At least a part of each signal connection line 32 is the heavily doped semiconductor connection line 321.

In an operation S40, arranging an encapsulation layer 40; successively arranging the first encapsulation layer 41, the second encapsulation layer 42, and the third encapsulation layer 43, which are laminated, in a direction away from the substrate 10. The first encapsulation layer 41 and the third encapsulation layer 43 include the silicon-containing compound material, and the second encapsulation layer 42 include the organic material. The first encapsulation layer 41 is arranged to wrap around the display unit 20 and a portion of each signal connection line 32. At least a portion of each signal connection line 32 disposed inside the region covered by the encapsulation layer 40 is the heavily doped semiconductor connection line 321, such that the first encapsulation layer 41 wraps around the heavily doped semiconductor connection line 321.

In the present embodiment, the substrate 10 provided in the operation S10 may be the substrate 10 provided in the above embodiments. In the present embodiment, a structure and a function of the substrate 10 is the same as or similar to the structure and the function of the substrate 10 provided in the above embodiments, and the substrate 10 provided in the operation S10 and the substrate 10 provided in the above embodiments may achieve a same technical effect, which may be referred to the above description and will not be repeated here.

In the operation S20, while manufacturing the display unit 20 on the substrate 10, the drive circuit layer 21 may firstly be arranged on the substrate 10, and the planarized layer 22 may be arranged on a side of the drive circuit layer 21 away from the substrate 10. In this way, the ground potential on the side of the drive circuit layer 21 away from the substrate 10 is planarized. Subsequently, the operation S30 is performed. The signal connection lines 32 are arranged between the effective display region 11 of the substrate 10 and the binding portion 31. At least a part of each of the signal connection lines 32 is the heavily doped semiconductor connection line 321.

Figure 9:
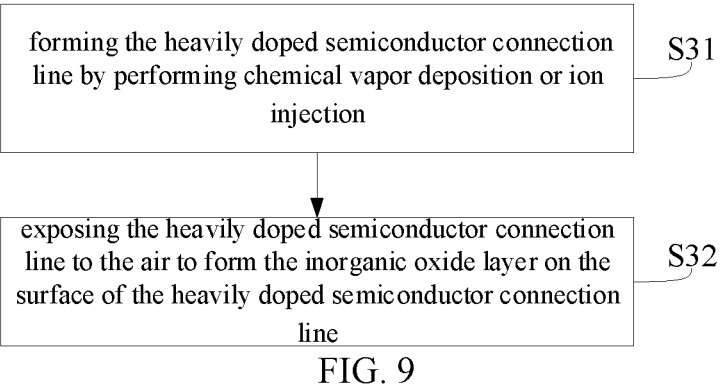
FIG. 9 is a flow chart of performing an operation S30 in FIG. 8 according to an embodiment of the present disclosure.

In detail, as shown in FIG. 9, FIG. 9 is a flow chart of performing an operation S30 in FIG. 8 according to an embodiment of the present disclosure. The operation S30 may include following operations.

In an operation S31, forming the heavily doped semiconductor connection line 321 by performing chemical vapor deposition or ion injection.

In an operation S32, exposing the heavily doped semiconductor connection line 321 to the air to form the inorganic oxide layer 3212 on the surface of the heavily doped semiconductor connection line 321.

In the operation S21, the chemical vapor deposition may be performed, silane, phosphorane and hydrogen may be taken as film-forming gases to form phosphorus-doped semiconductor silicon, i.e., the N-type semiconductor silicon. Alternatively, silane, borane and hydrogen may be taken as the film-forming gases to form boron-doped semiconductor silicon, i.e. the P-type semiconductor silicon. Alternatively, the chemical vapor deposition may be performed firstly, taking silane and hydrogen as the film-forming gases to form the semiconductor silicon. Subsequently, the ion injection may be performed, taking phosphorane as a primary gas to inject phosphorus ions to form the phosphorus-doped semiconductor silicon. Alternatively, borane may be taken as the original gas, injecting boron ions to form boron-doped semiconductor silicon. Further, the amount of phosphorane or silane may be controlled to regulate the ion doping concentration in the heavily doped semiconductor connection line 321, and the doping concentration may be regulated to be greater than or equal to $10^{19}$ cm$^{-3}$ to improve the conductivity performance of the heavily doped semiconductor connection line 321.

In detail, the operation S30 may further include an operation S311 and/or an operation S312.

In the operation S311, the metal connection line 322 is arranged between the effective display region 11 and the binding portion 31. An end of the metal connection line 322 is connected to an end of the heavily doped semiconductor connection line 321 to form at least a portion of the signal connection line 32. Further, a length of the metal connection line 322 is greater than a length of the heavily doped semiconductor connection line 321.

In the operation S312, a first metal wire 323 and a second metal wire 324 are arranged between the effective display region 11 and the binding portion 31. The first metal line 323, the heavily doped semiconductor connection line 321 and the second metal connecting line 322 are connected in sequence to form at least part of the signal connection line 32. In addition, the sum of the length of the first metal line 323 and the length of the second metal line 324 is greater than the length of the heavily doped semiconductor connection line 321.

The operation of arranging the metal connection line 322 in the operation S311, the operation of arranging the first metal line 323 and the second metal line 324 in the operation S312, and the operation S20 may be performed at the same time. In the operation S312, the first metal line 323 and the second metal line 324 are arranged between the effective display region 11 and the binding portion 31. The metal line may be manufactured firstly, and subsequently the metal line may be broken in the middle, forming the first metal line 323 and the second metal line 324. Alternatively, the first metal line 323 and the second metal line 324 are manufactured independently. Alternatively, the first metal line 323, the second metal line 324, and metal layers of a source electrode and a drain electrode may be manufactured at the same time.

In the operation S32, the surface of the doped semiconductor connection line may be reacted with the oxygen and the nitrogen, forming the inorganic oxide layer 3212, i.e., a silicon oxynitride layer.

Before performing the operation S40, the operation S20 needs to be completed, and that is, operation of arranging the organic light emitting unit 23 on the side of the planarized layer 22 away from the substrate 10. A mask template may be placed at a predetermined position, vacuum evaporation may be performed to form the organic light emitting unit 23 on the planarized layer 22, such that arranging the display unit 20 may be completed.

In the operation S40, the chemical vapor deposition, the inkjet printing and the chemical vapor deposition may be performed successively to successively form the first encapsulation layer 41, the second encapsulation layer 42 and the third encapsulation layer 43 on the side of the display unit 20 away from the substrate 10. The first encapsulation layer 41 and the third encapsulation layer 43 include the silicone-containing compound material. For example, the first encapsulation layer 41 and the third encapsulation layer 43 may include the silicon oxynitride material and the silicon nitride material, respectively. Further, when the end of the signal connection line 32 near the binding portion 31 is the metal line, the encapsulation layer 40 needs to completely cover the heavily doped semiconductor connection line 321 to protect the heavily doped semiconductor connection line 321. In this way, when the heavily doped semiconductor connection line 321 is in a more severe environment subsequently, the strength of the heavily doped semiconductor connection line 321 may not be less than the strength of the metal line, the heavily doped semiconductor connection line 32 may not be broken abnormally, and the display panel 1 may not display images abnormally.

According to the method of preparing the display panel 1 as described in the present embodiment, the specific structure and function of the display panel 1 is the same as or similar to the specific structure and function of the display panel 1 in the above embodiments, and the display panel 1 of the present embodiment and the display panel 1 of the above embodiments can achieve the same technical effect, which may be referred to the above embodiments and will not be repeated here.

Figure 10:
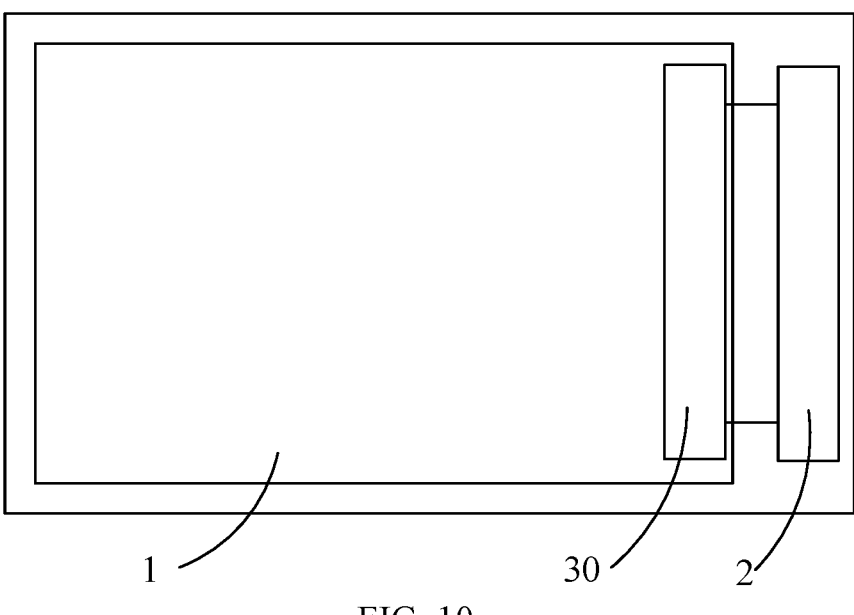
FIG. 10 is a structural schematic view of a display device according to an embodiment of the present disclosure.

As shown in FIG. 10, FIG. 10 is a structural schematic view of a display device according to an embodiment of the present disclosure. In the present embodiment, a display apparatus 100 is provided and includes the display panel 1 and a control board 2.

The display panel 1 is configured to display images and is the display panel 1 described in the above embodiments or is the display panel 1 prepared by the above method of preparing the display panel 1. The specific structure and function of the display panel 1 is the same as or similar to the specific structure and function of the display panel 1 in the above embodiments, and the display panel 1 of the present embodiment and the display panel 1 of the above embodiments can achieve the same technical effect, which may be referred to the above embodiments and will not be repeated here.

The control board 2 includes a drive IC configured to the binding portion 31 of the display panel 1, such that the driver IC transmits control signals to the display unit 20 of the display panel 1 through the binding portion 31, and therefore, the display panel 1 is controlled to display a corresponding image.

The above description shows only embodiments of the present disclosure and does not limit the scope of the present disclosure. Any equivalent structure or equivalent process transformation performed based on the specification and the accompanying drawings of the present disclosure, directly or indirectly applied in other fields, shall be equally covered by the scope of the present disclosure.

What is claimed is:

1. A display panel, comprising:
a substrate, comprising an effective display region and a non-display region adjacent to the effective display region, wherein the substrate comprises a silicon-containing compound material;
a display unit, configured to display an image and arranged in the effective display region, which is located on a side of the substrate;
a binding unit, arranged in the non-display region, which is located on a side of the substrate, and comprising a binding portion and a plurality of signal connection lines, wherein two ends of each of the plurality of signal connection lines are connected to the display unit and the binding portion, respectively;
an encapsulation layer, wrapping the display unit and a part of the plurality of signal connection lines, and configured to encapsulate the display unit and the plurality of signal connection lines, wherein the encapsulation layer comprises a first encapsulation layer, a second encapsulation layer and a third encapsulation layer, which are laminated successively in a direction away from the substrate; the first encapsulation layer and the third encapsulation layer comprise the silicon-containing compound material, and the second encapsulation layer comprises an organic material;
wherein the encapsulation layer covers a portion of each of the plurality of signal connection lines, at least a portion of each of the plurality of signal connection lines disposed inside a region covered by the encapsulation layer is configured as a heavily doped semiconductor connection line, and the first encapsulation layer wraps around the heavily doped semiconductor connection line;
wherein the portion of each of the plurality of signal connection lines covered by the encapsulation layer comprises a metal connection line and the heavily doped semiconductor connection line connected to the metal connection line; and lattice of the heavily doped semiconductor connection line is matched with lattice of the first encapsulation layer; the heavily doped semiconductor connection line comprises a heavily doped semiconductor layer and an inorganic oxide layer wrapping around a surface of the heavily doped semiconductor layer; an inorganic oxide substance of the inorganic oxide layer is formed by a semiconductor material of the heavily doped semiconductor layer being oxidized; the first encapsulation layer directly covers the inorganic oxide layer; lattice of the inorganic oxide layer, lattice of the heavily doped semiconductor layer, and the lattice of the first encapsulation layer match each other.

2. The display panel according to claim 1, wherein at least one connection line of the plurality of signal connection lines comprises a first metal line, the heavily doped semiconductor connection line and a second metal line, which are connected in sequence;
the first metal line is connected to the binding portion, and the second metal line is connected to the display unit, forming the signal connection line; and
a sum of a length of the first metal line and a length of the second metal line is greater than a length of the heavily doped semiconductor connection line.

3. The display panel according to claim 1, wherein the heavily doped semiconductor connection line comprises an N-type heavily doped semiconductor material or a P-type heavily doped semiconductor material; and
each of a doping concentration of the N-type heavily doped semiconductor material and a doping concentration of the P-type heavily doped semiconductor material is greater than or equal to $10^{19}$ cm$^{-3}$.

4. The display panel according to claim 1, wherein the inorganic oxide layer is wrapped by the first encapsulation layer.

5. A method of preparing a display panel, comprising:
providing a substrate, wherein the substrate comprises an effective display region and a non-display region adjacent to the effective display region, and the substrate comprises a silicon-containing compound material;
arranging a display unit and a binding portion on the substrate, wherein the display unit is formed in the effective display region on a side of the substrate, and the binding portion is formed in the non-display region on a side of the display unit;
arranging a plurality of signal connection lines in the non-display region between the effective display region and the binding portion, and electrically connecting two ends of each of the plurality of signal connection lines to a drive circuit layer and the binding portion, respectively, wherein at least a part of each of the plurality of signal connection lines is configured as a heavily doped semiconductor connection line;
arranging an encapsulation layer; successively arranging a first encapsulation layer, a second encapsulation layer, a third encapsulation layer, which are laminated, in a direction away from the substrate,

wherein the first encapsulation layer and the third encapsulation layer comprise a silicon-containing compound material, and the second encapsulation layer comprises an organic material;
the first encapsulation layer is arranged to wrap around the display unit and a portion of each of the plurality of signal connection lines;
at least a portion of each of the plurality of signal connection lines disposed inside a region covered by the encapsulation layer is configured as the heavily doped semiconductor connection line, and the first encapsulation layer wraps around the heavily doped semiconductor connection line; and
the portion of each of the plurality of signal connection lines covered by the encapsulation layer comprises a metal connection line and the heavily doped semiconductor connection line connected to the metal connection line; and lattice of the heavily doped semiconductor connection line is matched with lattice of the first encapsulation layer;
wherein the arranging a plurality of signal connection lines in the non-display region between the effective display region and the binding portion, and electrically connecting two ends of each of the plurality of signal connection lines to a drive circuit layer and the binding portion, respectively, comprises:
forming the heavily doped semiconductor connection line by performing chemical vapor deposition or ion injection;
exposing the heavily doped semiconductor connection line to the air to form an inorganic oxide layer on a surface of the heavily doped semiconductor connection line;
wherein, the inorganic oxide layer wraps around the surface of the heavily doped semiconductor layer; the first encapsulation layer directly covers the inorganic oxide layer; lattice of the inorganic oxide layer, lattice of the heavily doped semiconductor layer, and the lattice of the first encapsulation layer match each other.

6. The method according to claim 5,
wherein the heavily doped semiconductor connection line comprises an N-type heavily doped semiconductor material or a P-type heavily doped semiconductor material; and
each of a doping concentration of the N-type heavily doped semiconductor material and a doping concentration of the P-type heavily doped semiconductor material is greater than or equal to $10^{19}$ cm$^{-3}$.

7. The method according to claim 5, wherein the arranging a plurality of signal connection lines in the non-display region between the effective display region and the binding portion, and electrically connecting two ends of each of the plurality of signal connection lines to a drive circuit layer and the binding portion, respectively, comprises:
arranging a metal connection line between the effective display region and the binding portion, connecting an end of the metal connection line to an end of the heavily doped semiconductor connection line to form at least a portion of the signal connection line; and/or
arranging the first metal line and a second metal line between the effective display region and the binding portion; successively connecting the first metal line, the heavily doped semiconductor connection line and the second metal connecting line to form at least a portion of the signal connection line, wherein a sum of a length of the first metal line and a length of the second metal line is greater than a length of the heavily doped semiconductor connection line.

8. A display device, comprising:

a display panel, configured to display images; and a control board, bound to a binding portion and configured to control, through the binding portion, the display panel to display images, wherein the display panel comprises:

a substrate, comprising an effective display region and a non-display region adjacent to the effective display region, wherein the substrate comprises a silicon-containing compound material;

a display unit, configured to display an image and arranged in the effective display region, which is located on a side of the substrate;

a binding unit, arranged in the non-display region, which is located on a side of the substrate, and comprising a binding portion and a plurality of signal connection lines, wherein two ends of each of the plurality of signal connection lines are connected to the display unit and the binding portion, respectively;

an encapsulation layer, wrapping the display unit and a part of the plurality of signal connection lines, and configured to encapsulate the display unit and the plurality of signal connection lines, wherein the encapsulation layer comprises a first encapsulation layer, a second encapsulation layer and a third encapsulation layer, which are laminated successively in a direction away from the substrate; the first encapsulation layer and the third encapsulation layer comprise the silicon-containing compound material, and the second encapsulation layer comprises an organic material;

wherein the encapsulation layer covers a portion of each of the plurality of signal connection lines, at least a portion of each of the plurality of signal connection lines disposed inside a region covered by the encapsulation layer is configured as a heavily doped semiconductor connection line, and the first encapsulation layer wraps around the heavily doped semiconductor connection line;

the portion of each of the plurality of signal connection lines covered by the encapsulation layer comprises a metal connection line and the heavily doped semiconductor connection line connected to the metal connection line; and lattice of the heavily doped semiconductor connection line is matched with lattice of the first encapsulation layer;

the heavily doped semiconductor connection line comprises a heavily doped semiconductor layer and an inorganic oxide layer wrapping around a surface of the heavily doped semiconductor layer; an inorganic oxide substance of the inorganic oxide layer is formed by a semiconductor material of the heavily doped semiconductor layer being oxidized; the first encapsulation layer directly covers the inorganic oxide layer; lattice of the inorganic oxide layer, lattice of the heavily doped semiconductor layer, and the lattice of the first encapsulation layer match each other.

9. The display device according to claim 8, wherein at least one connection line of the plurality of signal connection lines comprises a metal connection line and the heavily doped semiconductor connection line connected to the metal connection line.

10. The display device according to claim 8, wherein at least one connection line of the plurality of signal connection lines comprises a first metal line, the heavily doped semiconductor connection line and a second metal line, which are connected in sequence;

the first metal line is connected to the binding portion, and the second metal line is connected to the display unit, forming the signal connection line; and a sum of a length of the first metal line and a length of the second metal line is greater than a length of the heavily doped semiconductor connection line.

11. The display device according to claim 8, wherein the heavily doped semiconductor connection line comprises an N-type heavily doped semiconductor material or a P-type heavily doped semiconductor material; and each of a doping concentration of the N-type heavily doped semiconductor material and a doping concentration of the P-type heavily doped semiconductor material is greater than or equal to $10^{19}$ cm$^{-3}$.

12. The display device according to claim 8, wherein the inorganic oxide layer is wrapped by the first encapsulation layer.

* * * * *